(12) United States Patent
Choi et al.

(10) Patent No.: US 10,390,444 B2
(45) Date of Patent: Aug. 20, 2019

(54) DISPLAY DEVICE

(71) Applicant: Samsung Display Co., Ltd., Yongin-si, Gyeonggi-do (KR)

(72) Inventors: Sung Chul Choi, Hwaseong-si (KR); Han Sun Ryou, Seoul (KR); Man Sik Myeong, Seoul (KR)

(73) Assignee: Samsung Display Co. Ltd., Yongin-si (KR)

( * ) Notice: Subject to any disclaimer, the term of this patent is extended or adjusted under 35 U.S.C. 154(b) by 1 day.

(21) Appl. No.: 15/717,741

(22) Filed: Sep. 27, 2017

(65) Prior Publication Data

US 2018/0124931 A1 May 3, 2018

(30) Foreign Application Priority Data

Nov. 3, 2016 (KR) .......................... 10-2016-0146031

(51) Int. Cl.
*H05K 5/00* (2006.01)
*H05K 5/02* (2006.01)
*G06F 1/16* (2006.01)
*G09F 9/30* (2006.01)
*G02F 1/1333* (2006.01)

(52) U.S. Cl.
CPC ......... *H05K 5/0017* (2013.01); *G06F 1/1652* (2013.01); *G09F 9/301* (2013.01); *H05K 5/0217* (2013.01); *G02F 1/133305* (2013.01)

(58) Field of Classification Search
CPC .......................... H05K 5/0017; H05K 5/0217
See application file for complete search history.

(56) References Cited

U.S. PATENT DOCUMENTS

| | | | |
|---|---|---|---|
| 9,506,279 B2* | 11/2016 | Kauhaniemi | G06F 1/1652 |
| 9,818,961 B2* | 11/2017 | Hiroki | H01L 51/0097 |
| 2012/0307423 A1 | 12/2012 | Bohn et al. | |
| 2013/0037228 A1 | 2/2013 | Verschoor et al. | |
| 2015/0023030 A1* | 1/2015 | Tsukamoto | G06F 1/1652 362/419 |
| 2016/0118616 A1* | 4/2016 | Hiroki | H01L 51/0097 257/40 |
| 2016/0195901 A1* | 7/2016 | Kauhaniemi | G06F 1/1652 361/679.27 |

FOREIGN PATENT DOCUMENTS

| | | |
|---|---|---|
| KR | 10-2014-0026547 A | 3/2014 |
| KR | 10-2016-0009726 A | 1/2016 |
| KR | 10-2016-0088521 A | 7/2016 |
| WO | WO 2012/167204 A2 | 12/2012 |

* cited by examiner

*Primary Examiner* — Hoa C Nguyen
*Assistant Examiner* — Keith DePew
(74) *Attorney, Agent, or Firm* — Lewis Roca Rothgerber Christie LLP

(57) ABSTRACT

A display device reduces or minimizes a stress received by a display panel in a folded state. The display device includes a display panel including a bendable area; and a panel support portion combined to the display panel and including a multi-joint member to support the bendable area, and the multi-joint member includes a plurality of joint portions sequentially arranged in a first direction and combined to each other to rotate with respect to one another, and at least one of the joint portions includes an elastic plate at an edge of a support side arranged toward the bendable area.

13 Claims, 9 Drawing Sheets

DISPLAY DEVICE

CROSS-REFERENCE TO RELATED APPLICATION

This application claims priority to and the benefit of Korean Patent Application No. 10-2016-0146031, filed on Nov. 3, 2016 in the Korean Intellectual Property Office, the entire content of which is incorporated herein by reference.

BACKGROUND

1. Field

Aspects of embodiments of the present disclosure relate to a display device.

2. Description of the Related Art

A flexible display panel is a display panel generated by disposing a plurality of pixels on a flexible substrate, such as a plastic film, and it is easily bendable. Recently, foldable display devices using the flexible display panel have been under research and development. The foldable display device includes a panel support portion for supporting a flexible display panel. The panel support portion is configured to be changeable between a folded state and an unfolded state.

Part of the flexible display panel is bent while it is folded, and a bending degree must be less than a threshold value determined in consideration of a characteristic of a material that is weak in deformation from among a plurality of materials configuring the flexible display panel, for example, an inorganic material. The life span of the foldable display device may be longer when the stress applied to the flexible display panel is reduced while the foldable display device is folded.

The above information disclosed in this Background section is only for enhancement of understanding of the background of the described technology and, therefore, it may contain information that does not form the prior art that is already known in this country to a person of ordinary skill in the art.

SUMMARY

According to an aspect of embodiments of the present disclosure, a foldable display device is provided. According to another aspect, a display device reduces or minimizes a stress provided to a flexible display panel while the display device is folded.

According to one or more exemplary embodiments, a display device includes a display panel and a panel support portion. The display panel includes a bendable area. The panel support portion is combined to the display panel, and includes a multi-joint member to support the bendable area. The multi-joint member includes a plurality of joint portions. Joint portion of a plurality of joint portions are sequentially arranged in a first direction, and are combined to each other to rotate with respect to one another. At least one of a plurality of joint portions includes an elastic plate at an edge of a support side arranged toward the bendable area.

The at least one joint portion may include two elastic plates that are disposed on respective edges of the support side in the first direction. The at least one joint portion may include a main body with a trapezoidal shape in a cross-sectional view, and a wedge-shaped groove may be provided between the main body and the elastic plate.

The elastic plate may include a fixed terminal connected to the main body, and an unfixed terminal opposite to the fixed terminal, and the elastic plate may be bent with respect to the fixed terminal and may closely contact the main body when a pressure is applied to the support side.

The support side included by the at least one joint portion may include a center support side corresponding to an upper side of the main body, and an upper side of the elastic plate provided on one side of the center support side. In the unfolded state, the center support side may be parallel to the upper side of the elastic plate, and in the folded state, the upper side of the elastic plate may have a slanted angle with respect to the center support side.

In the folded state, neighboring joint portion of the plurality of joint portions may closely contact each other, and the bendable area that is bent may apply a pressure to the elastic plate to transform the elastic plate.

The panel support portion may further include two support plates at respective sides of the multi-joint member, and the two support plates and the joint portions may be combined to each other by a plurality of rotation combiners respectively including a rotation shaft. The rotation combiners may be arranged at an outside of the respective sides of the display panel in a second direction traversing the first direction.

In an embodiment, the display panel may include two of the bendable areas that are separated from each other by a distance. The panel support portion may include two multi-joint members corresponding to the two bendable areas, and a center support plate between the two multi-joint members.

The center support plate and the joint portions may be combined to each other by a plurality of rotation combiners respectively including a rotation shaft. The rotation combiners may be arranged at an outside of the respective sides of the display panel in a second direction traversing the first direction.

According to an aspect of one or more exemplary embodiments, the display device may reduce the stress received by the display panel in the folded state by a transformation of the elastic plate, and the display device may have a reduced possibility of damage of the display panel to increase the durability and life span of the product.

DETAILED DESCRIPTION

Figure 1:
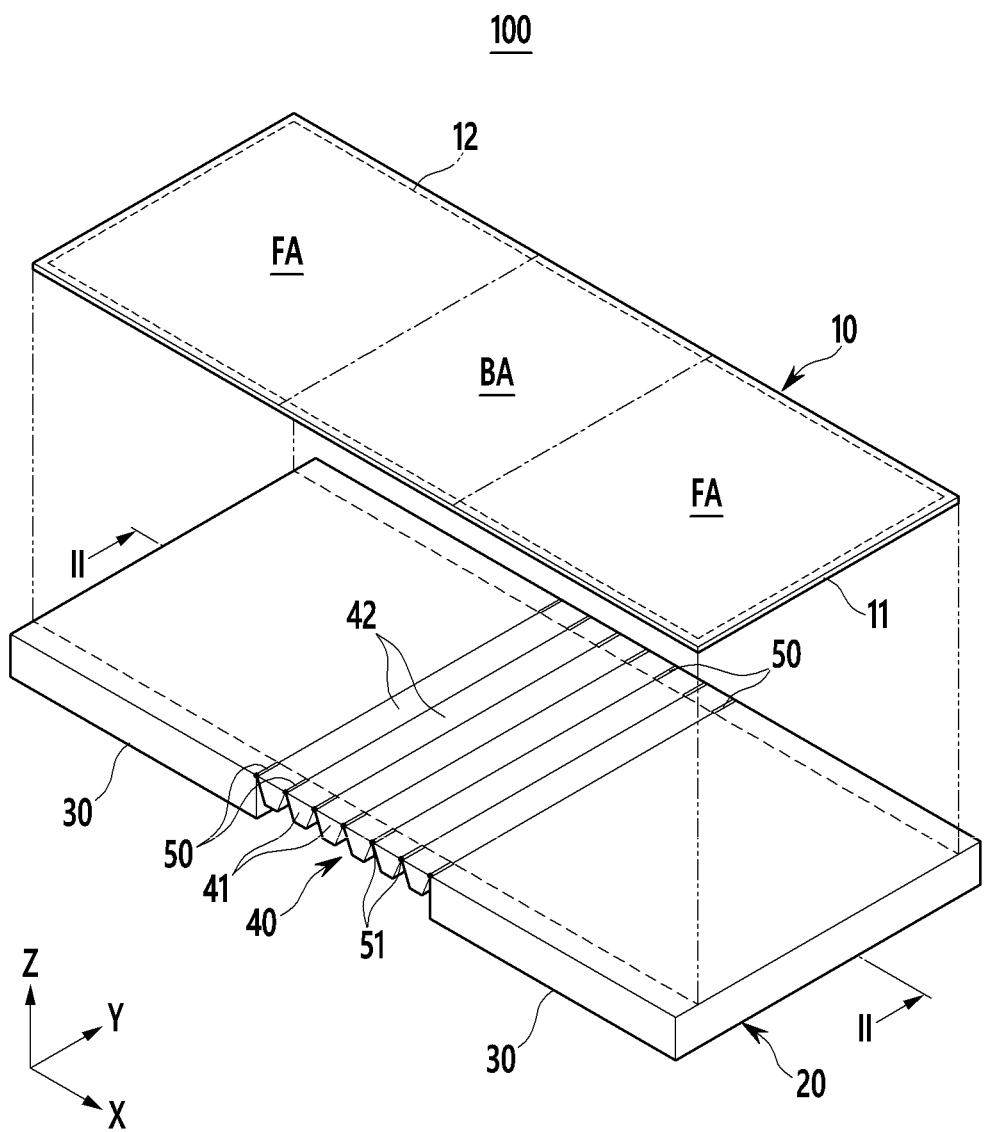
FIG. 1 shows an exploded perspective view of an unfolded state of a display device according to an exemplary embodiment.

The present disclosure will be described more fully hereinafter with reference to the accompanying drawings, in which some exemplary embodiments of the disclosure are shown. As those skilled in the art would realize, the described embodiments may be modified in various different ways, all without departing from the spirit or scope of the present disclosure.

Accordingly, the drawings and description are to be regarded as illustrative in nature and not restrictive. Like reference numerals designate like elements throughout the specification.

The size and thickness of each configuration shown in the drawings may be arbitrarily shown for better understanding and ease of description, and the present disclosure is not limited thereto. In the drawings, the thicknesses of layers, films, panels, regions, etc., may be exaggerated for clarity. For example, for better understanding and ease of description, the thicknesses of some layers and areas may be exaggerated.

It will be understood that when an element, such as a layer, film, region, or substrate, is referred to as being "on" another element, it may be directly on the other element or intervening elements may also be present. In contrast, when an element is referred to as being "directly on" another element, there are no intervening elements present.

The words "on" or "above" mean positioned on, above, or below the object portion, and do not necessarily mean positioned on the upper side of the object portion based on a gravitational direction.

In addition, unless explicitly described to the contrary, the word "comprise" and variations such as "comprises" or "comprising" are to be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

Figure 2:
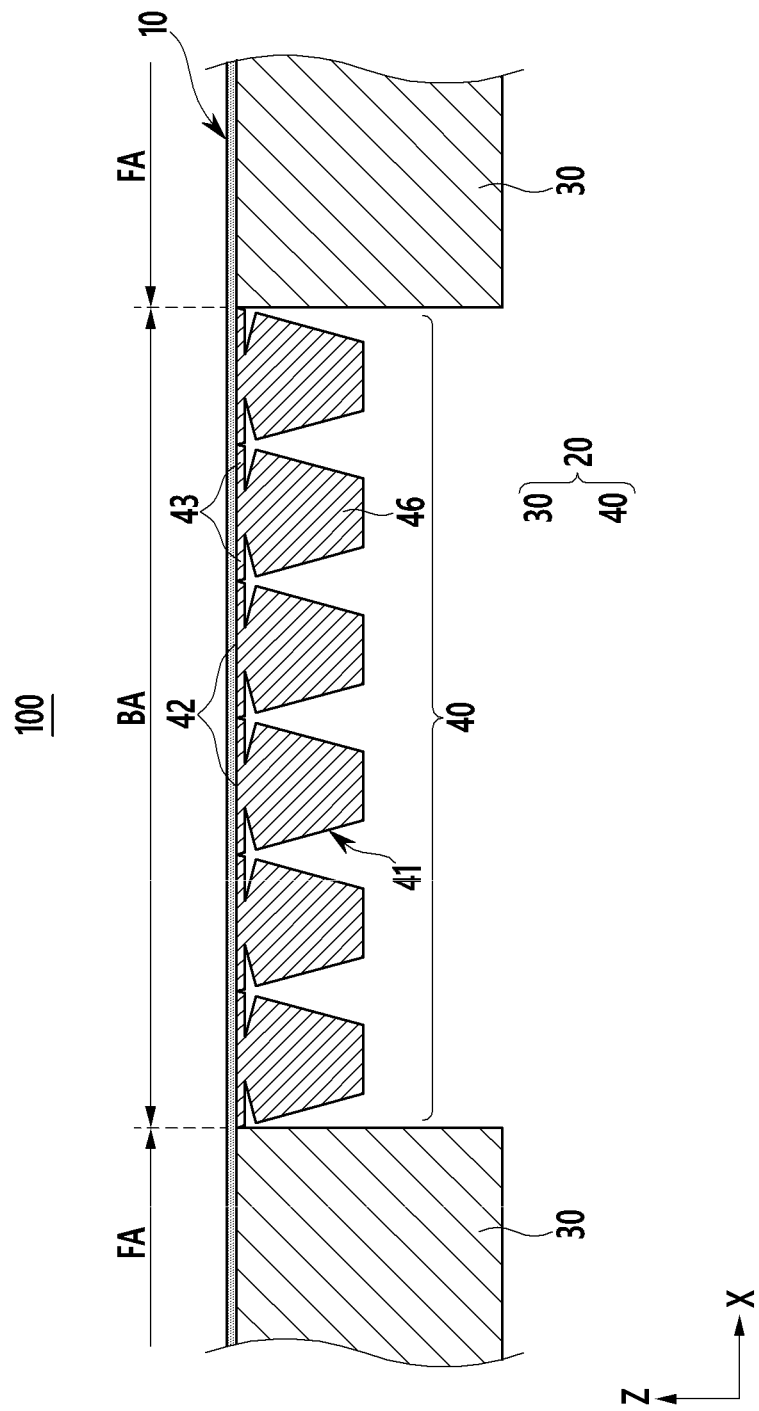
FIG. 2 shows a cross-sectional view of a combined state of a display device with respect to a line II-II of FIG. 1.

FIG. 1 shows an exploded perspective view of an unfolded state of a display device according to an exemplary embodiment; and FIG. 2 shows a cross-sectional view of a combined state of a display device with respect to a line II-II of FIG. 1.

Referring to FIG. 1 and FIG. 2, a display device 100 according to an exemplary embodiment includes a display panel 10 and a panel support portion 20 combined to the display panel 10 and supporting the display panel 10.

The display panel 10 includes a flexible substrate 11 and a display unit 12 provided on the flexible substrate 11. In an embodiment, the flexible substrate 11 may include a plastic film, and the display unit 12 may include a plurality of pixels and a plurality of driving circuits. The display panel 10 may include any of an organic light emitting panel, a liquid crystal panel, and an electrophoretic display panel, but is not limited thereto.

The display panel 10 includes a flat area (FA) and a bendable area (BA). For example, the display panel 10 may be divided into a bendable area (BA) provided in a center thereof, and two flat areas (FA) provided on respective sides of the bendable area (BA). Lengths of the two flat areas (FA) in a first direction (e.g., an X direction) may be equal to or different from each other.

The panel support portion 20 may include two support plates 30 corresponding to the two flat areas (FA), and a multi-joint member 40 corresponding to the bendable area (BA). The multi-joint member 40 includes a plurality of joint portions 41 sequentially arranged in the first direction (e.g., the X direction).

In an embodiment, the joint portions 41 may respectively have a bar shape extending in a second direction (e.g., a Y direction) crossing the first direction (e.g., the X direction), and may have a trapezoidal shape in the cross-sectional view. The joint portions 41 respectively include a support side 42 facing the bendable area (BA). In the unfolded state, support sides 42 of a plurality of support sides 42 are provided in parallel to each other.

In an embodiment, two support plates 30 may be combined to the plurality of joint portions 41 by a plurality of rotation combiners 50. The rotation combiners 50 may be provided to respective outsides of the display panel 10 in the second direction (e.g., the Y direction). The rotation combiners 50 may respectively have a rotation shaft 51, and the joint portions 41 may rotate with respect to two rotation shafts 51.

Figure 3:
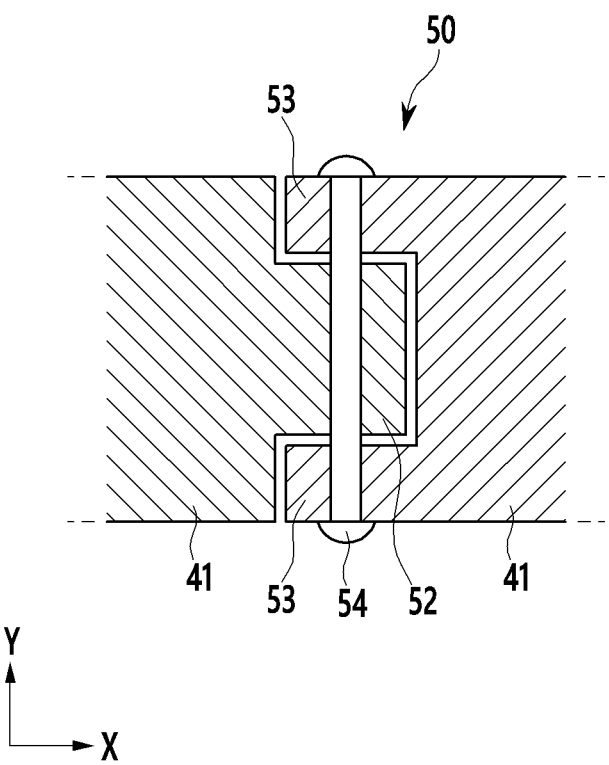
FIG. 3 shows a cross-sectional view of a rotation combiner shown in FIG. 1, according to an embodiment.

In an embodiment, the rotation combiner 50 may be configured with a hinge assembly having a hinge shaft, and, in this case, the rotation shaft 51 includes a hinge shaft. FIG. 3 shows a cross-sectional view of a rotation combiner shown in FIG. 1, according to an embodiment.

Referring to FIG. 3, the rotation combiner 50 may include a first link arm 52 connected to one of the joint portions 41, a second link arm 53 connected to another of the joint portions 41, and a hinge shaft 54 passing through the first link arm 52 and the second link arm 53 and combining the same. However, a configuration of the rotation combiner 50 is not limited to the illustrated example.

Referring to FIG. 1 and FIG. 2, in an embodiment, the flat area (FA) of the display panel 10 may be attached to the support plate 30 by an adhesive layer (not shown). The bendable area (BA) of the display panel 10 may not be attached to the multi-joint member 40. That is, in the unfolded state, the bendable area (BA) of the display panel 10 may maintain contact with a plurality of support sides 42 or stay slightly afloat from the support sides 42.

Figure 4:
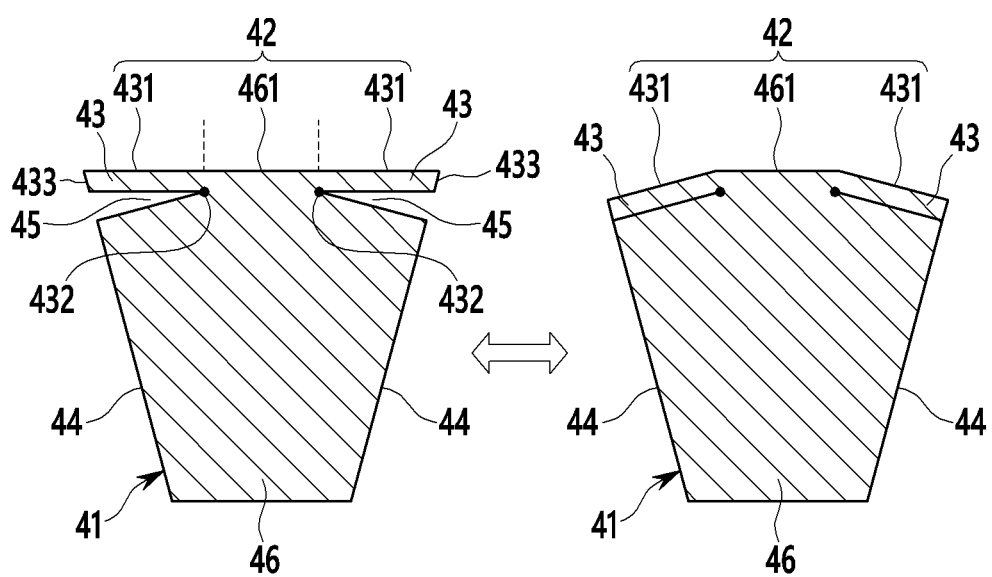
FIG. 4 shows a partial enlarged view of a multi-joint member of a display device shown in FIG. 2.

FIG. 4 shows a partial enlarged view of a multi-joint member of a display device shown in FIG. 2.

Referring to FIG. 2 and FIG. 4, at least one of the plurality of joint portions 41 includes two elastic plates 43 provided at respective edges of the support side 42. The two elastic plates 43 are provided at respective edges of the support side 42 in the first direction (e.g., the X direction) and are formed to be plates with a thickness (e.g., a predetermined thickness).

In an embodiment, the joint portion 41 may be made of a metal, such as aluminum, and a wedge-shaped groove 45 may be provided on an upper portion of two slanted sides 44 of the joint portion 41. By the groove 45, the joint portion 41 may be divided into a main body 46 and the two elastic plates 43 connected to the main body 46. The support side 42 of the joint portion 41 includes a center support side 461 corresponding to an upper side of the main body 46, and upper sides 431 of the two elastic plates 43 provided at respective sides of the center support side 461.

The elastic plates 43 respectively include a fixed terminal 432 connected to the main body 46, and an unfixed terminal 433 provided to be opposite to the fixed terminal 432. When a pressure is not applied to the support side 42 of the joint portion 41, the unfixed terminal 433 of the elastic plate 43 is separated from the main body 46 by the groove 45, and the upper sides 431 of the elastic plates 43 are provided in parallel to the center support side 461.

When a pressure is applied to the support side 42 of the joint portion 41, the elastic plate 43 is bent with respect to the fixed terminal 432, and a lower side of the elastic plate 43 may closely contact the main body 46. When the pressure is applied, the upper sides 431 of the elastic plates 43 form a slanted side that is bent from the center support side 461 at an angle (e.g., a predetermined angle). When the pressure applied to the support side 42 of the joint portion 41 is released, the elastic plate 43 is restored to the initial position by an elastic restoration force.

Figure 5:
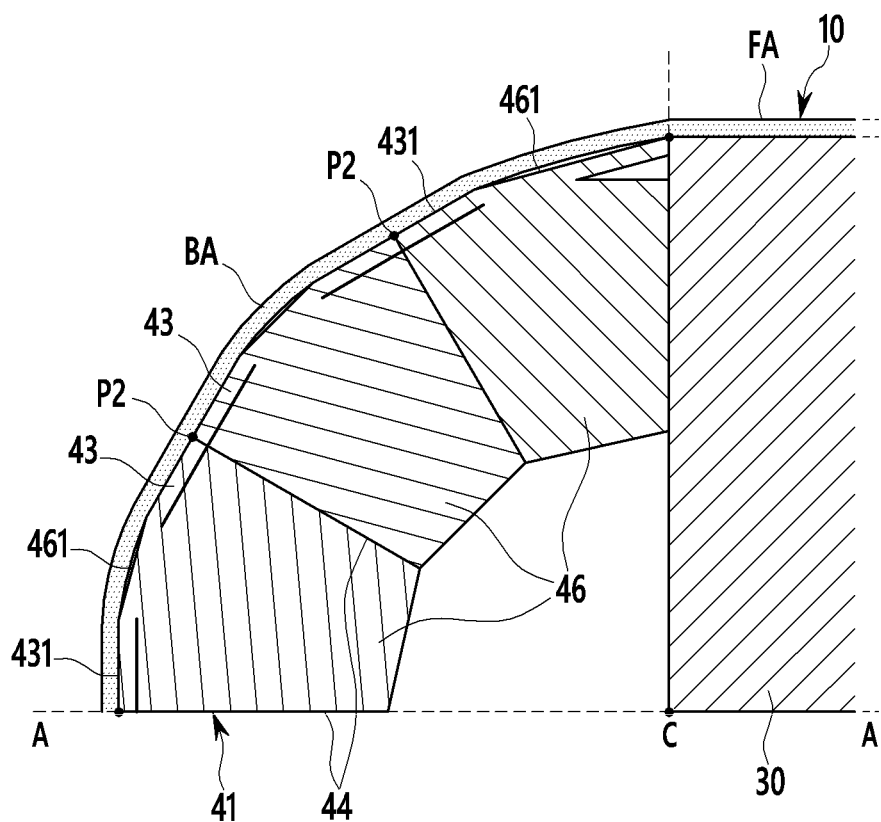
FIG. 5 shows a partial enlarged cross-sectional view of a display device shown in FIG. 2, in a folded state.

FIG. 5 shows a partial enlarged cross-sectional view of a display device shown in FIG. 2, in a folded state.

Referring to FIG. 4 and FIG. 5, the display device 100 is changed to the folded state when a plurality of joint portions 41 rotate with respect to the rotation shaft 51 (refer to FIG. 1) and the bendable area (BA) of the display panel 10 is bent to have an arc shape (e.g., a circular arc shape). In the folded state, the slanted sides 44 of neighboring joint portions 41 of the plurality of joint portions 41 may closely contact each other, and the plurality of support sides 42 may correspond to a semi-circle.

In an embodiment, the display device 100 is horizontally symmetrical with respect to a line A-A of FIG. 5. FIG. 5 illustrates a case in which the slanted sides 44 of three joint portions 41 closely contact each other, and three support sides 42 correspond to a circular quadrant; however, the number of joint portions 41 is not limited to the illustrated example.

Figure 6:
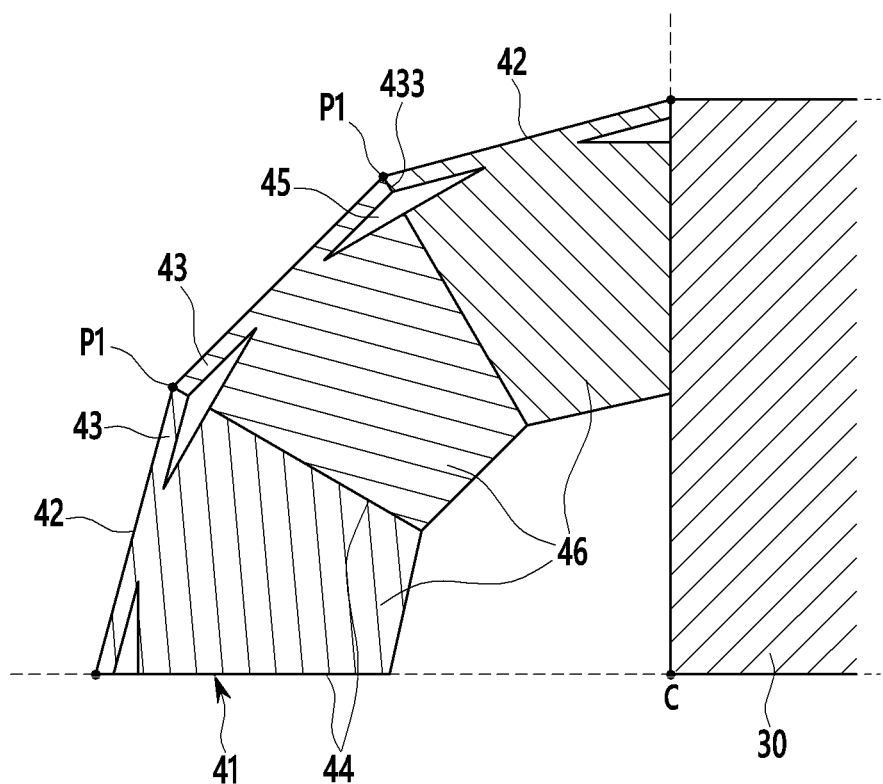
FIG. 6 shows a cross-sectional view of a multi-joint member in a display device shown in FIG. 5, without the display panel.

FIG. 6 shows a cross-sectional view of a multi-joint member in a display device shown in FIG. 5, without the display panel.

Referring to FIG. 6, in a case that there is no display panel 10, the plurality of support sides 42 included in the multi-joint member 40 do not receive pressure from the outside. Therefore, the elastic plates 43 included in the joint portions 41 maintain the initial state, that is, being separated from the main body 46 with the groove 45 therebetween.

In the folded state, neighboring support sides 42 of the plurality of support sides 42 included in the multi-joint member 40 contact each other at a first point P1. The first point P1 represents a point where an unfixed terminal 433 of an elastic plate 43 included in a joint portion 41 contacts an unfixed terminal 433 of an elastic plate 43 included in a neighboring joint portion 41.

Referring to FIG. 5, when the panel support portion 20 combined to the display panel 10 is changed to the folded state, the bendable area (BA) that is bent applies a pressure to the plurality of support sides 42 included in the multi-joint member 40. The pressure applied to the support side 42 by the bendable area (BA) that is bent becomes greater toward the respective edges of the support side 42 at which the elastic plate 43 is provided.

Therefore, the elastic plates 43 included in the multi-joint member 40 are bent with respect to the fixed terminal 432 by the pressure applied by the bendable area (BA) that is bent, and may closely contact the main body 46. That is, the upper sides 431 of the two elastic plates 43 are bent from the center support side 461 at an angle (e.g., a predetermined angle).

In the folded state, neighboring support sides 42 of the plurality of support sides 42 contact each other at a second point P2, and the second point P2 is provided nearer to a curvature center (C) of the bendable area (BA) that is bent than the first point P1 shown in FIG. 6 by a transformation of the elastic plate 43.

The multi-joint member 40 reduces the stress received by the bendable area (BA) of the display panel 10 in the folded state by a transformation of the elastic plate 43, and eases the tension of the bendable area (BA). Therefore, in the folded state, the display device 100 may reduce or control generation of defects and permanent transformation of the display panel 10, such as cracks or the like. The elastic plate 43 is restored into the initial form when it is changed to the unfolded state.

Figure 7:
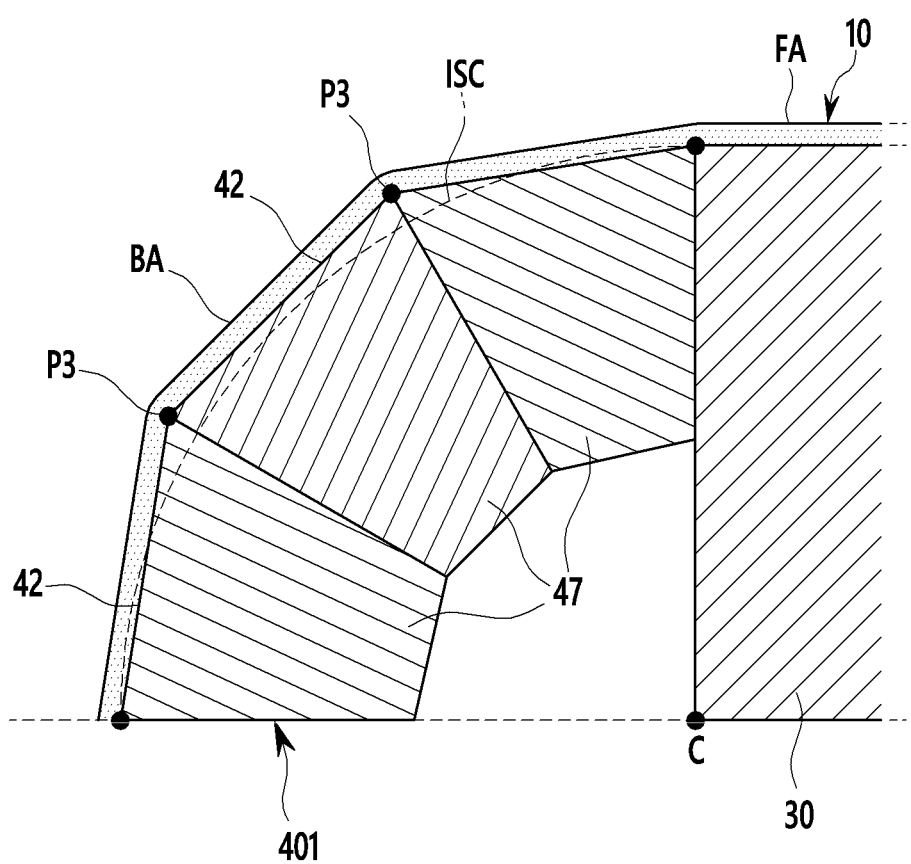
FIG. 7 shows a partial enlarged cross-sectional view of a display device according to a comparative example, in a folded state.

FIG. 7 shows a partial enlarged view of a display device according to a comparative example, in a folded state.

Referring to FIG. 7, regarding the display device according to a comparative example, a multi-joint member 401 does not include an elastic plate. That is, the multi-joint member 401 is configured with a plurality of joint portions 47 having a trapezoidal shape in a cross-sectional view.

In the case of the comparative example, in the folded state, a third point P3 where neighboring support sides 42 of a plurality of support sides 42 contact each other is provided outside a virtual circular arc (ISC) for connecting upper sides of the two support plates 30. Therefore, the multi-joint member 401 pushes the bendable area (BA) of the display panel 10 in an outward direction (i.e. a direction away from the curvature center (C)) from a plurality of third points P3 to transform the same.

The bendable area (BA) of the display panel 10 is partly bent at a portion where it contacts the plurality of third points P3, and the stress substantially increases at this point. The bent transformation increases a probability of damage of a layer that is sensitive to a transformation amount from among multilayers configuring the display panel 10.

For example, in an embodiment, the display panel 10 is configured with multilayers including a flexible substrate, a display unit, an encapsulation layer, a touch sensor, a polarization film, and a cover window. In this instance, a hard coating layer of the cover window or an inorganic insulating layer of the display unit has a brittle property and may be easily damaged by a transformation. Therefore, regarding the display device according to the comparative example, in the folded state, there is a high probability that a specific layer of the display panel 10 may be damaged by a steep increase of stress.

Referring to FIG. 5, the display device 100 according to an exemplary embodiment may reduce the stress received by the display panel 10 in the folded state by a transformation of the elastic plate 43. Therefore, the display device 100 according to an exemplary embodiment may reduce a probability of damage of the display panel 10 and may increase the durability and the life span of the product.

In an embodiment, from among a plurality of elastic plates 43 included in the multi-joint member 40, intensity of an external force applied to the support plate 30 and the elastic plate 43 may be less than intensity of external forces applied to other elastic plates 43. Therefore, the elastic plate 43 neighboring the support plate 30 may maintain the initial state or may have a smaller variation amount than the other elastic plates 43.

Figure 8:
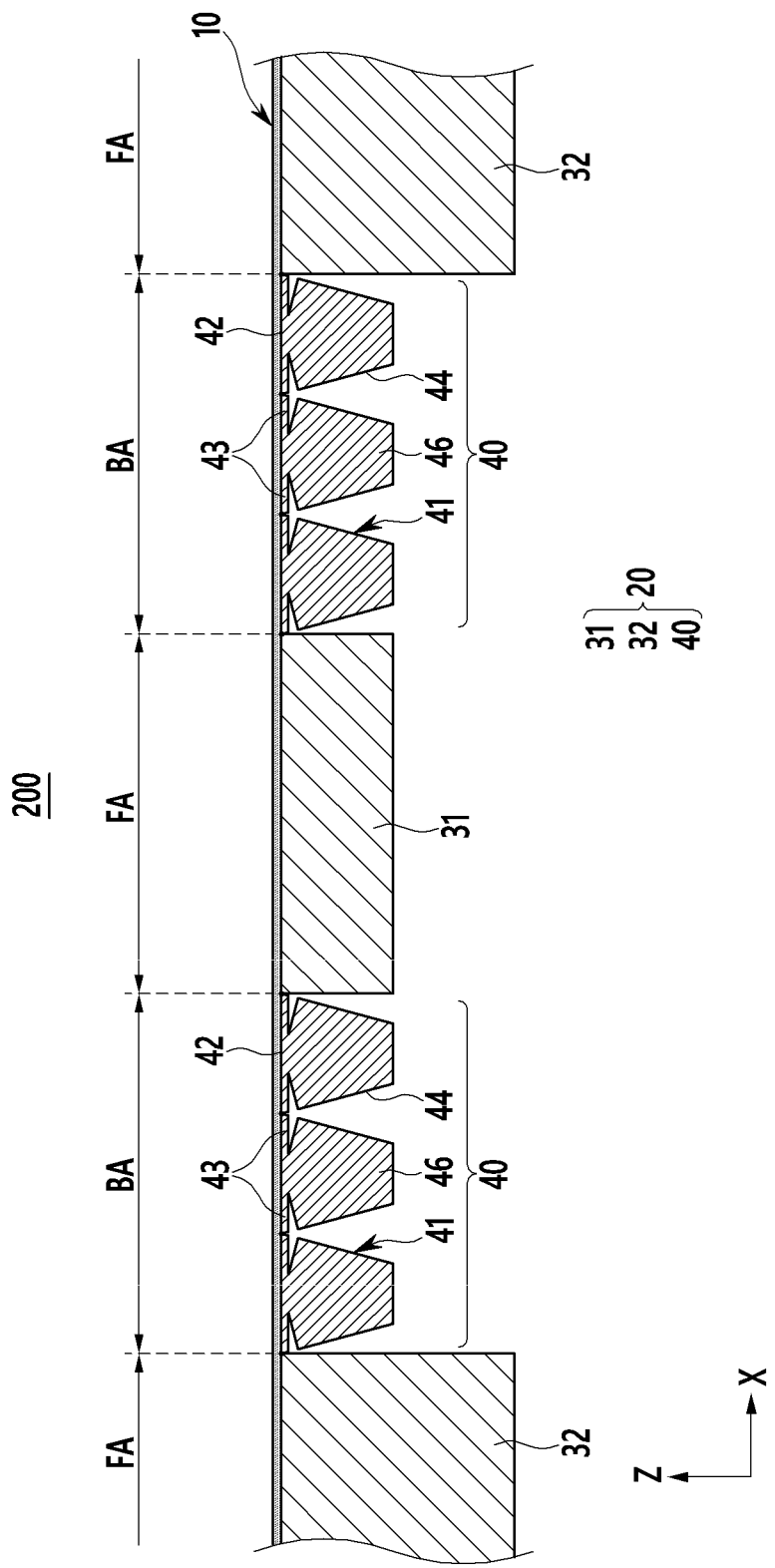
FIG. 8 shows a cross-sectional view of a display device in an unfolded state according to another exemplary embodiment.
Figure 9:
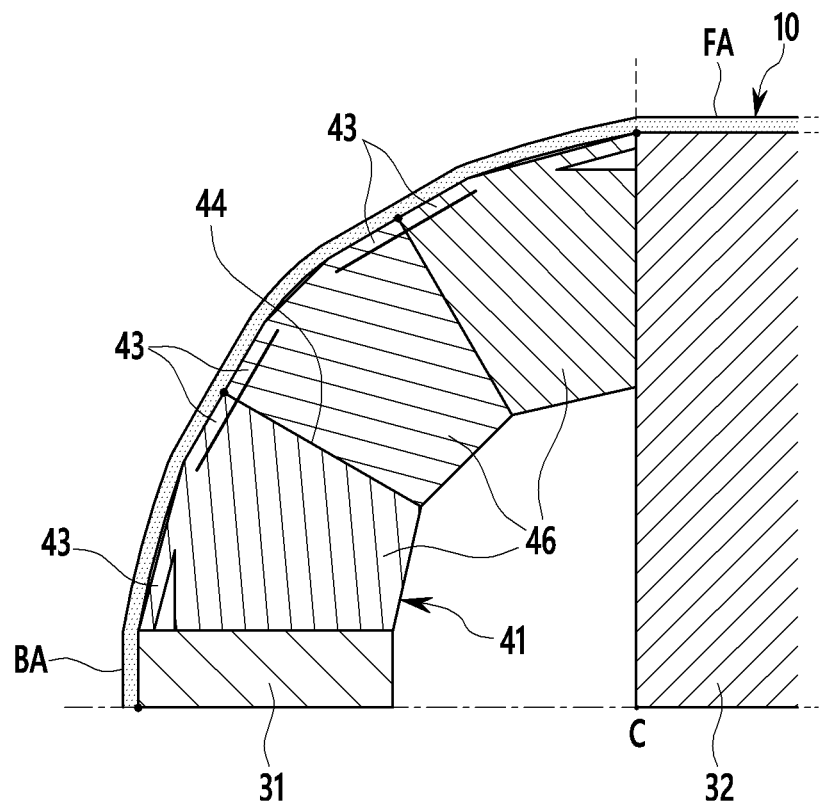
FIG. 9 shows a partial enlarged cross-sectional view of a display device shown in FIG. 8, in a folded state.

FIG. 8 shows a cross-sectional view of a display device in an unfolded state according to another exemplary embodiment; and FIG. 9 shows a partial enlarged view of a display device shown in FIG. 8, in a folded state.

Referring to FIG. 8 and FIG. 9, regarding a display device 200 according to another exemplary embodiment, the panel support portion 20 includes a center support plate 31, two multi-joint members 40 provided on respective sides of the center support plate 31, and a support plate 32 provided on another side of each of the two multi-joint members 40.

In an embodiment, the center support plate 31 may be provided in the center of the panel support portion 20, and the two multi-joint members 40 and the two support plates 32 may be disposed to be symmetrical with the center support plate 31 as a center thereof. In an embodiment, the multi-joint member 40 may be provided with the same configuration as the multi-joint member according to the above-described exemplary embodiment except for the number of joint portions 41.

In an embodiment, the multi-joint member 40 is combined to the center support plate 31 and the support plate 32 by a rotation combiner (not shown). In the folded state, the two support plates 32 face each other, and the slanted sides 44 of neighboring joint portions 41 of the plurality of joint portions 41 may closely contact each other. In an embodiment, a plurality of support sides 42 included in the multi-joint member 40 may correspond to a circular quadrant between the center support plate 31 and the support plate 32.

The display panel 10 may be divided into three flat areas (FA) corresponding to the center support plate 31 and the two support plates 32, and two bendable areas (BA) corresponding to two multi-joint members 40. In an embodiment, the flat area (FA) of the display panel 10 may be attached to at least part of the center support plate 31 by an adhesive layer (not shown).

The display device 200 according to an exemplary embodiment is provided with a configuration that is the same as or similar to the above-described display device 100 except that the multi-joint member 40 is divided into two and the center support plate 31 is provided between the two multi-joint members 40.

While this disclosure has been described in connection with what are presently considered to be some practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a display panel including a bendable area; and
   a panel support portion overlying the display panel and comprising a multi-joint member to support the bendable area,
   wherein the multi-joint member includes a plurality of joint portions sequentially arranged in a first direction and combined to each other to rotate with respect to one another, and the joint portions each comprise a support side arranged toward the bendable area,
   wherein the joint portions each comprise two elastic plates at respective edges of the support side in the first direction,
   wherein the joint portions each comprise a main body,
   wherein the elastic plates each include a fixed terminal connected to the main body and an unfixed terminal opposite to the fixed terminal,
   wherein the unfixed terminal is spaced apart from the main body in an unfolded state, and
   wherein the support side is between the display panel and the main body along a thickness direction of the display panel.

2. The display device of claim 1, wherein at least one of the main bodies of the joint portions has a trapezoidal shape in a cross-sectional view, and a wedge-shaped groove is defined between one of the main bodies and one of the elastic plates.

3. The display device of claim 2, wherein at least one of the elastic plates is bent with respect to the fixed terminal and closely contacts the main body connected to the fixed terminal of the elastic plate which is bent when a pressure is applied to one of the support sides.

4. The display device of claim 3, wherein at least one of the support sides included by the joint portions includes a center support side corresponding to an upper side of one of the main bodies, and upper sides of the elastic plates at each side of the center support side.

5. The display device of claim 4, wherein, in the unfolded state, the center support side is parallel to the upper sides of the elastic plates, and, in a folded state, the upper sides of the elastic plates have slanted angles with respect to the center support side.

6. The display device of claim 2, wherein joint portions of the plurality of joint portions are rotatable with respect to one another about a second direction traversing the first direction, and the elastic plates are located between the bendable area and the wedge-shaped groove along the thickness direction traversing each of the first and second directions.

7. The display device of claim 1, wherein, in the folded state, neighboring joint portions of the plurality of joint portions closely contact each other, and the bendable area that is bent applies a pressure to the elastic plates to transform the elastic plates.

8. The display device of claim 1, wherein the panel support portion further comprises two support plates at respective sides of the multi-joint member, and the two support plates and the joint portions are combined to each other by a plurality of rotation combiners respectively comprising a rotation shaft.

9. The display device of claim 8, wherein the rotation combiners are arranged at an outside of the respective sides of the display panel in a second direction traversing the first direction.

10. The display device of claim 1, wherein the display panel includes two bendable areas that are separated from each other by a distance, and the panel support portion comprises two multi-joint members corresponding to the two bendable areas, and a center support plate between the two multi-joint members.

11. The display device of claim 10, wherein the center support plate and the joint portions are combined to each other by a plurality of rotation combiners respectively comprising a rotation shaft.

12. The display device of claim 11, wherein the rotation combiners are arranged at an outside of the respective sides of the display panel in a second direction traversing the first direction.

13. A display device comprising:
   a display panel including a bendable area; and
   a panel support portion overlying the display panel and comprising a multi-joint member to support the bendable area,
   wherein the multi-joint member includes a plurality of joint portions sequentially arranged in a first direction and combined to each other to rotate with respect to one another, and the joint portions each comprise a support side arranged toward the bendable area,
   wherein the joint portions each comprise two elastic plates at respective edges of the support side in the first direction,
   wherein the joint portions each comprise a main body, wherein the elastic plates each include a fixed terminal connected to the main body and an unfixed terminal opposite to the fixed terminal, wherein the unfixed terminal is spaced apart from the main body, and wherein joint portions of the plurality of joint portions extend in a second direction traversing the first direction from a first side of the bendable area to a second side of the bendable area opposite the first side.

* * * * *